(12) United States Patent
Young et al.

(10) Patent No.: US 7,613,009 B2
(45) Date of Patent: Nov. 3, 2009

(54) ELECTRICAL TRANSITION FOR AN RF COMPONENT

(75) Inventors: Thomas M Young, Dublin (IE); Brian Kearns, Dublin (IE)

(73) Assignee: TDK Corporation, Tokyo (JP)

( * ) Notice: Subject to any disclaimer, the term of this patent is extended or adjusted under 35 U.S.C. 154(b) by 535 days.

(21) Appl. No.: 11/374,994

(22) Filed: Mar. 15, 2006

(65) Prior Publication Data

US 2007/0217175 A1 Sep. 20, 2007

(51) Int. Cl.
H05K 7/02 (2006.01)
H05K 7/06 (2006.01)
H05K 7/08 (2006.01)
H05K 7/10 (2006.01)

(52) U.S. Cl. .................. 361/782; 361/763; 361/783

(58) Field of Classification Search ......... 361/764–765, 361/782–785; 333/12–14, 33
See application file for complete search history.

(56) References Cited

U.S. PATENT DOCUMENTS

| | | | |
|---|---|---|---|
| 5,225,969 A | | 7/1993 | Takaya et al. |
| 5,406,125 A | * | 4/1995 | Johnson et al. ............ 257/774 |
| 5,428,885 A | | 7/1995 | Takaya et al. |
| 5,982,256 A | | 11/1999 | Uchimura et al. |
| 6,232,660 B1 | * | 5/2001 | Kakimoto et al. ........... 257/728 |
| 6,400,008 B1 | * | 6/2002 | Farnworth ................. 257/698 |
| 6,624,521 B2 | | 9/2003 | Staiculescu et al. |
| 6,727,777 B2 | * | 4/2004 | McDonough et al. ......... 333/33 |

* cited by examiner

*Primary Examiner*—Tuan T Dinh
(74) *Attorney, Agent, or Firm*—Oliff & Berridge, PLC

(57) ABSTRACT

An RF electronic component for mounting on a substrate includes a housing; and at least one electronic device having an input and/or output incorporated in the housing. At least one input/output terminal connects to a connection pad on the substrate; and an electrical transition provides an electrical connection between the input/output terminal and an input/output of an electronic device incorporated in the electronic component. The electrical transition comprises a side termination at least partially located on an outer surface of the housing; and an array of conductive through holes formed inside the housing at an offset from the side termination. The array is arranged so that the axes of the through holes are substantially mutually parallel and coplanar, and the array of through holes is connected to form a ground plane at the offset from the side termination.

12 Claims, 9 Drawing Sheets

ELECTRICAL TRANSITION FOR AN RF COMPONENT

FIELD OF THE INVENTION

The present invention relates to an RF electronic component including an electrical transition for electrically connecting the RF component to a substrate.

BACKGROUND OF THE INVENTION

In the present specification, the term electronic device is defined as a device which does not necessarily include input/output terminals suitable for electrically connecting the device to a substrate. Examples of electronic devices include silicon or GaAs FETs, PIN diodes, silicon or GaAs IC die, acoustic devices such as surface acoustic wave (SAW) or bulk acoustic wave (BAW) resonators or filters, passive devices such as capacitors, inductors and resistors, which are fabricated in or on, for example, multi-layer low temperature co-fired ceramic (LTCC) substrates.

The term electronic component is defined as a component which includes input/output terminals suitable for connecting the component to a substrate, for example a printed circuit board (PCB) using connection techniques such as re-flow soldering. Examples of electronic components include packaged electronic devices, where the package includes terminals for connecting the component to the substrate, as well as multi-layer electronic components which include solder terminals.

Conventional discrete electronic components include an internal electronic device connected to metal input/output terminals located somewhere on the outer surface of the electronic component. Typically, the internal electronic device is housed in an outer enclosure or package, which includes the metal input/output terminals suitable for re-flow soldering. The input/output terminals of the outer enclosure are connected to input/output terminals of the internal device by one or more connectors.

One category of electronic component comprises input/output terminals which are located exclusively on the underside of the component; this type of electronic component usually employs metal-plated through holes, which run vertically through the outer enclosure of the component and which electrically connect the underside terminals of the component to internal device terminals or to internal pads which are connected to the device terminals by bond wires.

Another category of electronic component comprises input/output terminals which are partially or wholly located on the sides of the component—hereinafter referred to as side terminations. Such electronic components typically comprise one or more insulating substrate layers where electrical connections between the side terminations of the electronic component to the input/output terminals of the internal device are achieved by metal traces which are fabricated on one or more surfaces of the substrate layers of the electronic component. U.S. Pat. No. 5,428,885, Takaya describes in detail an electronic component comprising side terminations wherein a connector is employed to connect an internal electronic device of the electronic component to the side terminations of the electronic component. The connector by which the internal electronic device is connected to metal input/output terminals of an electronic component is referred to hereinafter as an electrical transition.

In RF including microwave applications, an electronic component is usually mounted on a substrate which includes a pattern of metal microstrip transmission lines or coplanar waveguide transmission lines. Each transmission line originates at a connection pad which is connected to one of the component input/output terminals and terminates at a remote location on the substrate. These metal transmission lines electrically connect the component to some other circuitry mounted on or connected to the substrate. The use of suitable transmission lines on the substrate (for example microstrip transmission lines with a characteristic impedance of 50 Ohms) ensures that the optimum electrical properties of the component are available at the remote location on the substrate where the transmission line terminates.

When an electrical component is required to operate at RF including microwave frequencies, the electrical characteristics of the electrical transition between the input/output of the component and the input/output of the internal device affect the electrical characteristics of the component. Ideally the electrical transition from the connection pad on the carrier substrate, which is connected to the input/output terminal of the component, to the input/output of the internal device should not introduce any electrical discontinuity in the path between the connection pad on the carrier substrate and the input/output of the internal device.

The description of side terminations in U.S. Pat. No. 5,428,885 takes no account of the requirement that the transitions from the connection pads on the carrier substrate to the inputs/outputs of the internal device should not introduce a discontinuity. A poor choice of transition can give rise to dissipative and mismatch losses, particularly at high frequencies of operation of the component or where the height of the side termination is comparable to one quarter of the wavelength of the input and output signals of the electronic component.

It is advantageous if the transition from the connection pad to the input/output terminal of the internal device is designed so that this transition effectively extends the transmission line on the carrier substrate of the electronic component from the connection pad on the substrate to the input/output of the internal device of the electronic component thereby eliminating any discontinuity in the signal path.

U.S. Pat. No. 6,624,521, Staiculescu relates to flip chip design on a coplanar waveguide with a pseudo-coaxial ground bump configuration. Staiculescu describes an RF coaxial transition comprising an annulus of solder balls which surround a central solder ball for the connection of a terminal of a flip-chip device to a pad at the end of a transmission line on a carrier substrate. The diameter of the annulus of solder balls and the dimensions of the solder balls are chosen so that the transition has the characteristics of a coaxial transmission line.

The RF coaxial transition described in U.S. Pat. No. 6,624,521 addresses some of the problems resulting from the discontinuity introduced by a typical electrical transition for an RF electronic component; however, it has a number of limitations. The electrical transition described in U.S. Pat. No. 6,624,521 does not provide a solution for the connection of an electronic component to a carrier substrate where the connection is achieved by re-flow soldering or in cases where the connection from the solder pad at the end of the transmission line on the carrier substrate to the internal device of the electronic component is achieved by side terminations. Furthermore the transition described in U.S. Pat. No. 6,624,521 does not provide a solution for the case when the electronic component has terminals which are connected by an internal connector to an internal device of the component as described above.

SUMMARY OF THE INVENTION

It is an object of the present invention to mitigate the above problems.

Accordingly, the present invention provides an RF electronic component as claimed in claim 1.

BRIEF DESCRIPTION OF THE DRAWINGS

Embodiments of the invention will now be described, by way of example, with reference to the accompanying drawings, in which:

FIG. 2 shows a metal land pattern on the top surface of the substrate of FIG. 1a;

FIG. 4b shows the metal footprint on the bottom surface of the electronic component of FIG. 4a;

FIG. 5 shows the metal land pattern on the top surface of the substrate of FIG. 4a; and FIG. 6 shows S Parameters from a 3D electromagnetic simulation of the component shown in FIG. 4a.

DESCRIPTION OF THE PREFERRED EMBODIMENTS

Figure 1A:
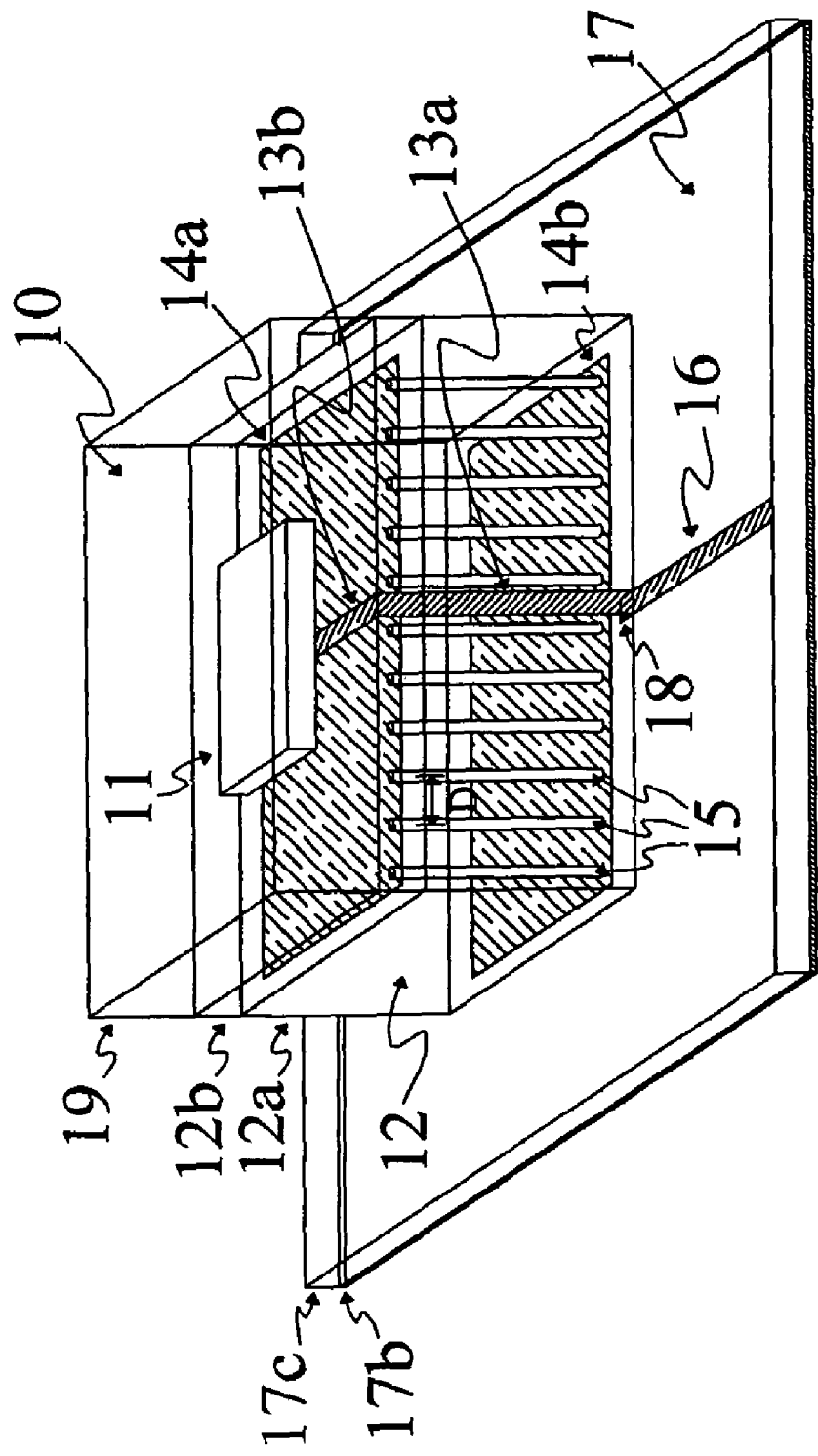
FIG. 1a shows an RF electronic component including an electrical transition according to a first embodiment of the present invention mounted on a substrate.
Figure 1B:
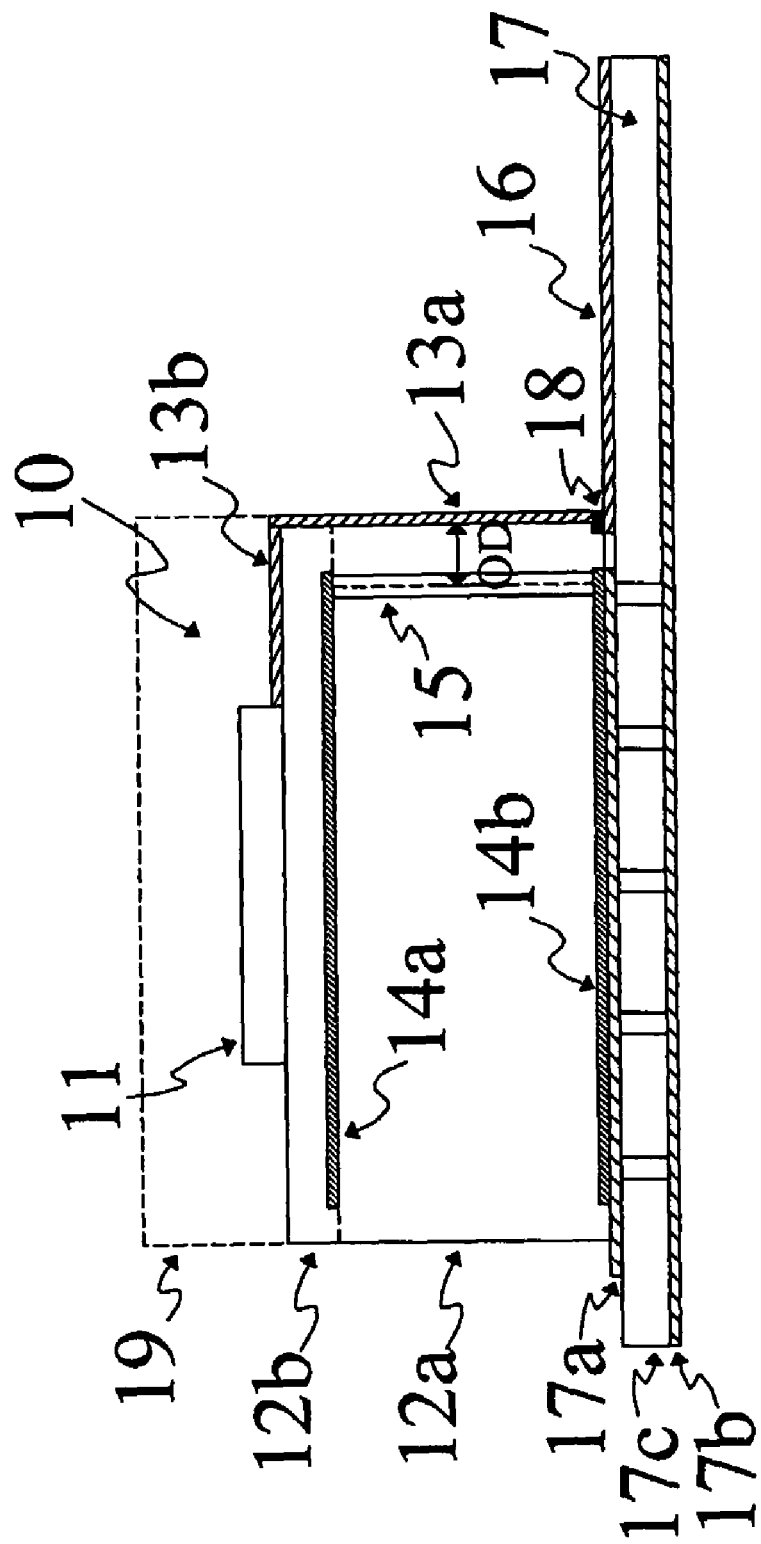
FIG. 1b shows the electronic component and substrate of FIG. 1a in elevation.

FIG. 1a shows an RF electronic component 10 including an electrical transition according to a first embodiment of the present invention. FIG. 1b shows the same RF component in elevation. The RF electronic component 10 comprises a multilayer substrate 12, a top covering layer 19, and an internal device 11 which is mounted on the top surface of multilayer substrate 12. RF electronic component 10 further comprises a strip like side termination 13a which is vertically orientated on an outer surface of multilayer substrate 12 and an electrical connector 13b which connects an input/output of internal device 11 to side termination 13a. RF side termination 13a is connected to input/output terminal 18 of RF electronic component 10 which is located on the bottom surface of multilayer substrate 12. A microstrip transmission line 16 on a carrier substrate 17 is electrically connected to input/output terminal 18 of RF electronic component 10. In typical applications, microstrip transmission line 16 is connected to input/output terminal 18 of RF electronic component 10 by a soldering process, such as re-flow soldering.

The multilayer substrate 12 of the first embodiment of the present invention comprises two layers, lower layer 12a and upper layer 12b. Lower layer 12a is bounded on it's top and bottom surfaces by metal ground planes 14a and 14b respectively; an array of cylindrical metal plated or metal filled through holes 15 is formed in lower layer 12a, so that each of the metal plated through holes 15 is connected to bottom ground plane 14b and to top ground plane 14a. The cylindrical metal plated through holes are arranged so that their axes of symmetry are parallel to each other with an appropriate spacing D and so that their axes are coplanar with each other. Hence, the array of metal plated through holes 15 forms a vertical ground plane. The vertical ground plane formed by the array of metal plated through holes 15 is horizontally offset from side termination 13a by an offset distance OD. Offset distance OD of the vertical ground plane to side termination 13a, the width of side termination 13a and the dielectric constant of the substrate material determine a characteristic impedance of the electrical transition.

Carrier substrate 17 is a three layer structure comprising a top metal layer 17a and a bottom metal layer 17b, sandwiching an insulation layer 17c. Microstrip transmission line 16 which is connected to input/output terminal 18 of RF electronic component 10 is fabricated on top metal layer 17a of carrier substrate 17. The thickness of insulation layer 17c and the width of microstrip transmission line 16 on carrier substrate 17 are both chosen so that the resulting structure has the required characteristic impedance.

Figure 1C:
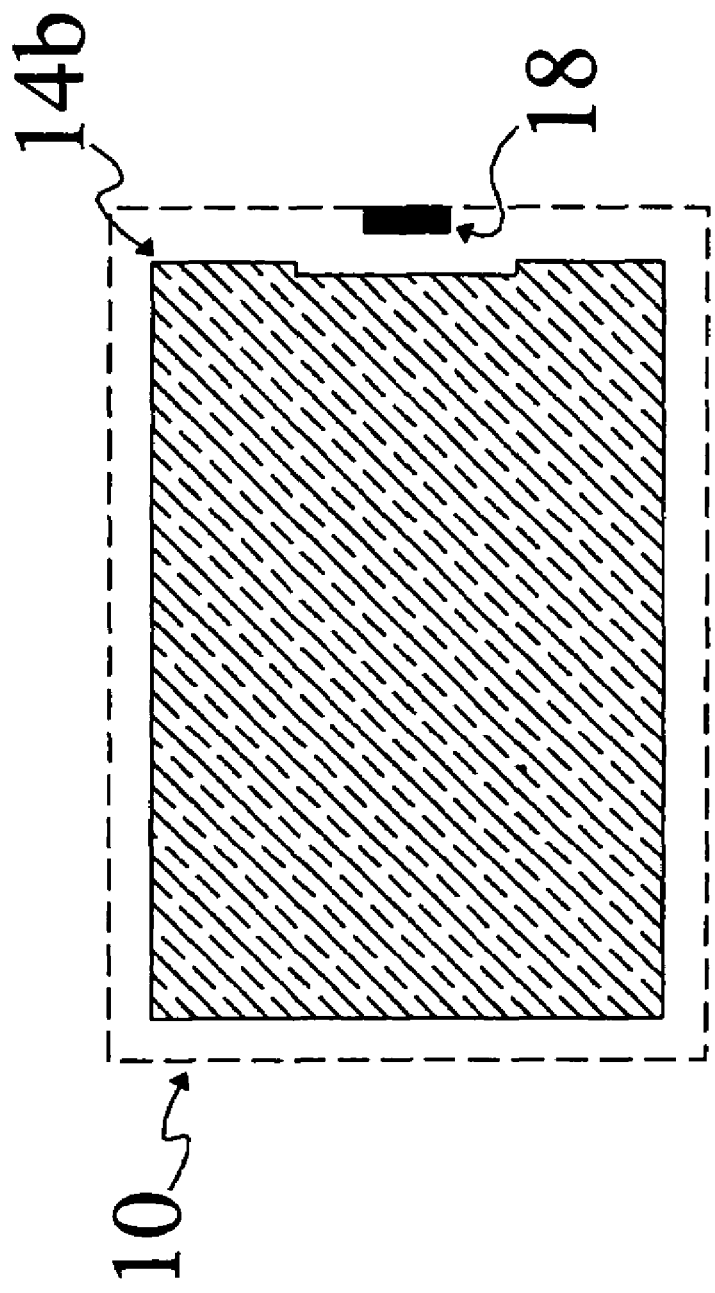
FIG. 1c shows a metal footprint on the bottom surface of the electronic component of FIG. 1a and FIG. 1b.
Figure 2:
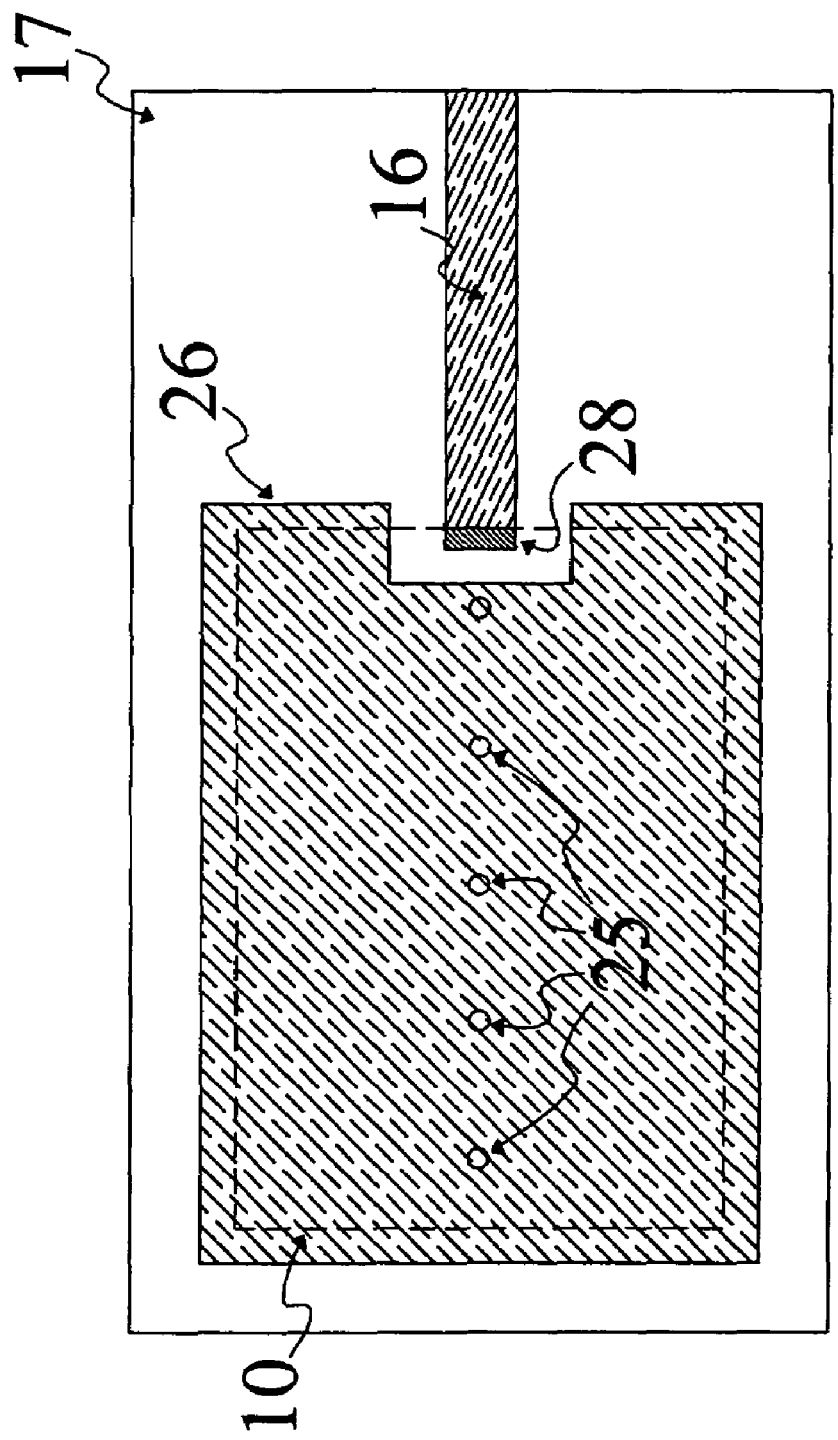

FIG. 1c shows the metal pattern on the bottom of RF electronic component 10 (referred to hereafter as a footprint) and FIG. 2 shows a top view of carrier substrate 17, upon which RF electronic component 10 is mounted. The outer edges of RF electronic component 10 are represented in FIG. 1c and FIG. 2 by dotted lines.

Top metal layer 17a of carrier substrate 17 includes a land pattern comprising a ground pattern 26, and a solder pad 28 where ground pattern 26 and solder pad 28 substantially mirror the footprint of RF electronic component 10 shown in FIG. 1c. Thus, when RF electronic component 10 is soldered to carrier substrate 17, input/output terminal 18 of RF electronic component 10 aligns with solder terminal 28 on carrier substrate 17, and bottom ground plane 14b of electronic component 10 aligns substantially with ground pattern 26—in practice ground pattern 26 is often chosen to be slightly larger than bottom ground plane 14b of RF electronic component 10 in order to provide a catchment area on carrier substrate 17 for excess solder.

Ground pattern 26 is typically connected to bottom metal layer 17b of carrier substrate 17 by a multiplicity of metal plated through holes 25.

For operation at 24 GHz, the array of metal plated through holes 15 of RF electronic component 10 produces an effective ground plane in the vertical direction when the spacing D of the axes of symmetry of each of the cylindrical through holes is 300 μm. As an example, the characteristic impedance of the transition formed by side termination 13a, and the array of metal plated through holes 15 is approximately 50 Ohms for the case when the dielectric constant $\in_r$ of the multilayer substrate 12 has a value of 6, when the width of the side termination 13a is 350 μm, and when the offset distance OD is 240 μm. TABLE 1 below provides some examples of physical dimensions of the electrical transition of FIG. 1 which are required to produce a characteristic impedance of 50 Ohms for various values of the dielectric constant of multilayer substrate 12.

TABLE 1

Examples of the physical dimensions of the electrical transition of FIG. 1 which are required to produce a characteristic impedance of 50 Ohms.

| | Dielectric Constant of Substrate 12 | | |
|---|---|---|---|
| | 6 | 75 | 3 |
| Offset Distance OD | 240 μm | 440 μm | 240 μm |
| Width of Transition 13a | 350 μm | 100 μm | 600 μm |
| Characteristic Impedance of Transition | 50 Ω | 50 Ω | 50 Ω |

Practical considerations for re-flow soldering require that the side terminations of an electronic component wrap around from the side of the component to a terminal on the underside of the electronic component. This underside terminal is represented by input/output terminal 18 in FIG. 1a, FIG. 1b and FIG. 1c above. For RF and microwave electronic components, typical dimensions of an underside terminal range from 250 µm to a few millimeters. The first embodiment described above and which is depicted in FIG. 1 does not take into account the effect that a large terminal on the underside of the component will have on the electrical characteristics of the transition. The lower section of an RF electronic component 30 comprising an electrical transition according to the first embodiment of the present invention, with a large input/output terminal 38 suitable for re-flow soldering is depicted in FIG. 3.

As before, the RF electronic component 30 comprises a multilayer substrate comprising a lower layer 32a which is bounded on its top and bottom surfaces by metal ground planes 34a and 34b respectively. An array of cylindrical metal plated or metal filled through holes 35 is formed in lower layer 32a, so that each of the metal plated through holes is connected to bottom ground plane 34b and to top ground plane 34a. RF electronic component 30 further comprises a strip like RF side termination 33a which is vertically orientated on an outer surface of lower layer 32b of the multilayer substrate. RF side termination 33a is connected to input/output terminal 38 of RF electronic component 30 which is located on the bottom surface of lower layer 32b of the multilayer substrate. A microstrip transmission line 36 on a carrier substrate 37 is electrically connected to input/output terminal 38 of RF electronic component 30.

Figure 3:
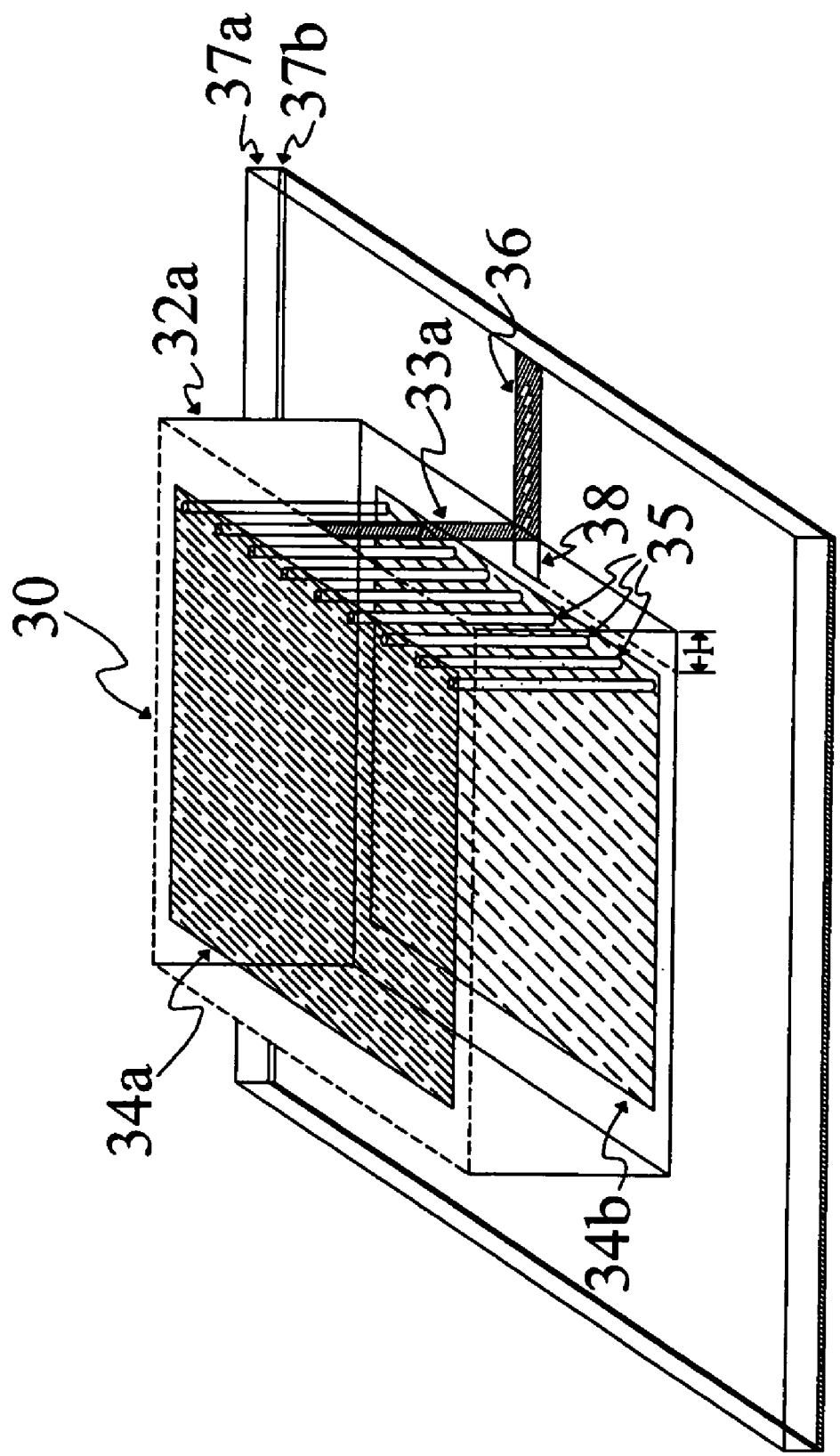
FIG. 3 shows a rotated lower section of the RF Electronic Component of FIG. 1a, with a long input/output terminal.

It can be seen from FIG. 3 that input/output terminal 38 of RF electronic component 30 can be represented electrically as an open circuit stub connected at one end of side termination 33a. The open circuit stub arising from input/output terminal 38 introduces an impedance which is connected in parallel with one end of side termination 33a. The effects of the parallel impedance introduced by input/output terminal 38 become significant at high frequencies or when the length l of input/output terminal 38 is significant when compared with the wavelength of an input or output signal of the RF electronic component 30.

The impedance of an open circuit stub is given by EQUATION 1 below.

$$Z_{OC} = -jZ_0 \times \cot\left(\frac{2\pi}{\lambda}l\right) \quad (1)$$

where $Z_0$ is the characteristic impedance of the stub, where l is the length of the stub and where $\lambda$ is the wavelength at which the impedance is to be calculated.

This expression becomes infinite for values of l which are given by the expression below:

$$l = n \times \frac{\lambda}{2} \Rightarrow Z_{OC} \to \infty \text{ (where } n \text{ is an integer)}$$

For all other values of l, the open circuit stub introduced by input/output terminal 38 affects the electrical characteristics of the RF transition.

The impedance of a short circuit stub is given by EQUATION 2 below.

$$Z_{SC} = jZ_0 \times \tan\left(\frac{2\pi}{\lambda}l\right) \quad (2)$$

This expression becomes infinite for values of l which are given by the expression below.

$$l = (2n+1)\frac{\lambda}{4} \Rightarrow Z_{OC} \to \infty \text{ (where } n \text{ is an integer)}$$

From EQUATION 2 above, it can be seen that when the electrical length of a short circuit stub is equal to $\lambda/4$ it's impedance becomes infinite. Therefore, the effects of the stub which are introduced when the length l of input/output terminal 38 is significant when compared with the wavelength $\lambda$ of an input or output signal can be eliminated by extending the length of input/output terminal 38 so that it is equal to $\lambda/4$ and by terminating it in a short circuit.

Figure 4A:
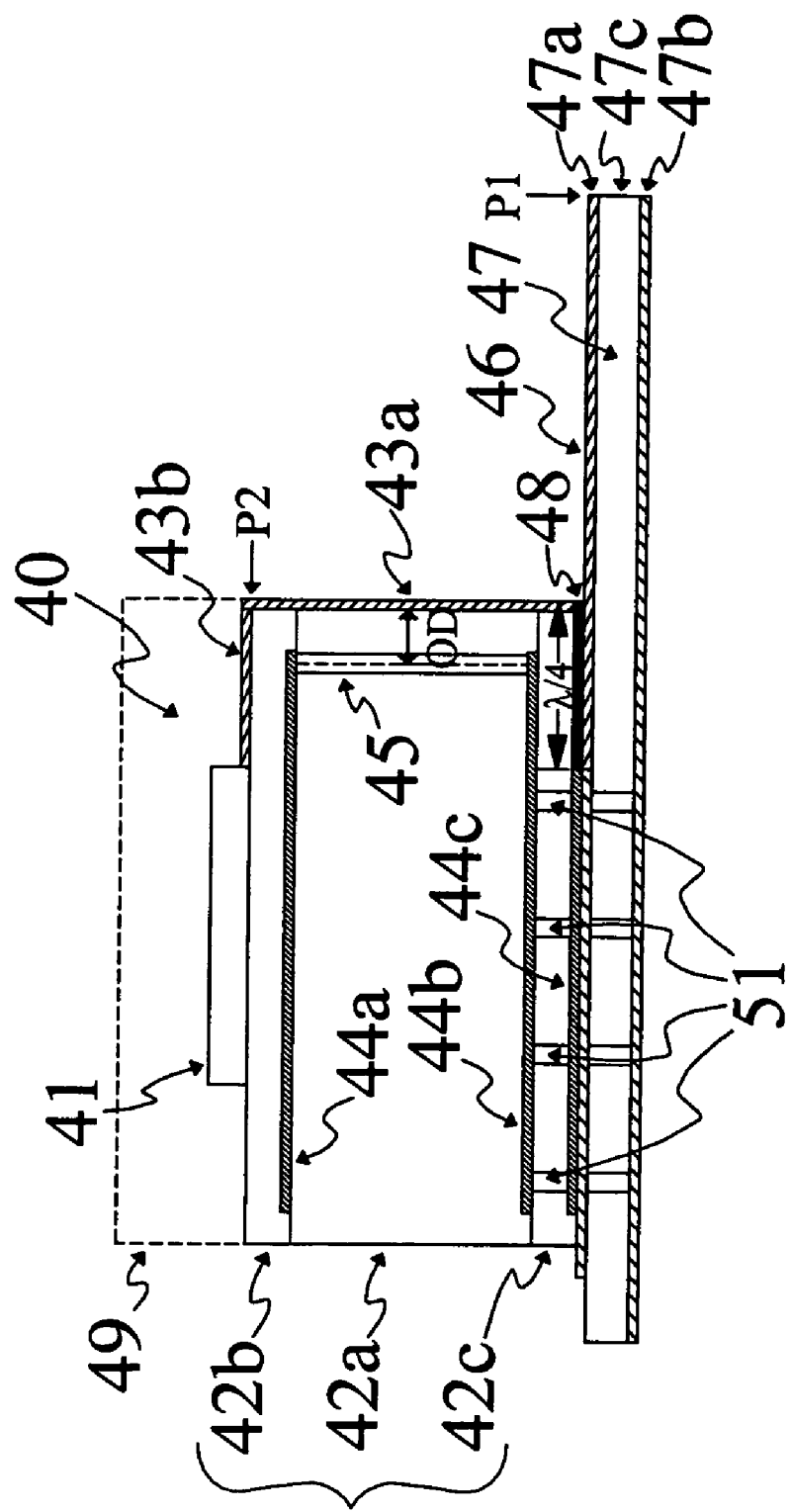
FIG. 4a shows an electronic component according to a second embodiment of the present invention in elevation.
Figure 4B:
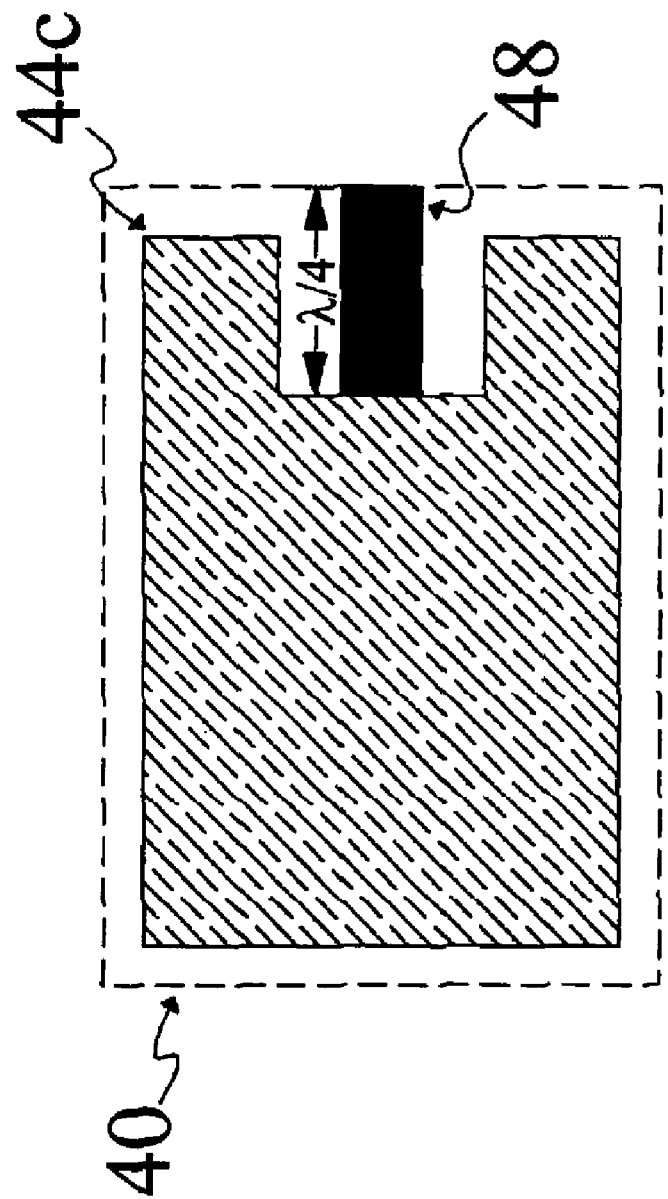

FIG. 4a shows an RF electronic component 40 according to a second embodiment of the present invention in elevation. FIG. 4b shows the metal footprint on the bottom surface of RF electronic component 40.

RF electronic component 40 comprises a multilayer substrate 42 comprising a sub-layer 42a sandwiched between an upper layer 42b and a lower layer 42c. RF component 40 further comprises a top covering layer 49, and an internal device 41, which is mounted on the top surface of upper layer 42b of multilayer substrate 42. A strip like side termination 43a is vertically orientated on an outer surface of multilayer substrate 42 and an electrical connector 43b connects an input/output of internal device 41 to side termination 43a. Side termination 43a is connected to input/output terminal 48 of electronic component 40 which is located on the bottom surface of lower layer 42c of multilayer substrate 42. A microstrip transmission line 46 on a carrier substrate 47 is electrically connected to input/output terminal 48 of RF electronic component 40. In typical applications, microstrip transmission line 46 is connected to input/output terminal 48 of RF electronic component 40 by a soldering process, such as re-flow soldering.

Sub layer 42a of multilayer substrate 42 is bounded on its top surface by metal ground plane 44a and on its bottom surface by metal ground plane 44b. An array of cylindrical metal plated or metal filled through holes 45 is formed in sub-layer 42a, so that each of the metal plated through holes of the array 45 is connected to ground plane 44a and to ground plane 44b. As before, the cylindrical metal plated through holes are arranged so that their axes of symmetry are parallel to each other with an appropriate spacing D and so that their axes are coplanar with each other. Consequently, the array of metal plated through holes 45 forms a vertical ground plane within sub-layer 42a of multilayer substrate 42. The vertical ground plane formed by the array of metal plated through holes 45 is horizontally offset from side termination 43a on the outer surface of multilayer substrate 42 by an offset distance OD.

Lower layer 42c is bounded on its top and bottom surfaces by ground planes 44b and 44c respectively, and ground planes 44b and 44c are connected to each other by a multiplicity of metal plated through holes 51. Input/output terminal 48 of RF component 40 is substantially rectangular in shape where the length of one side of input/output terminal 48 is equal to one quarter of the wavelength of the center frequency of the operating band of RF electronic component 40. The ends of terminal 48 are connected to side termination 43a, and to ground plane 44c respectively.

The offset distance OD from the vertical ground plane formed by the array of metal plated through holes 45 to side termination 43a, the width of the side termination 43a and the dielectric constant of the substrate material determine a characteristic impedance of the transition.

Carrier substrate 47 is a three layer structure comprising a top metal layer 47a and a bottom metal layer 47b, sandwiching an insulation layer 47c. A microstrip transmission line 46 of a given characteristic impedance is fabricated on top metal layer 47a of carrier substrate 47 and is connected to input/output terminal 48 of electronic component 40.

Figure 5:
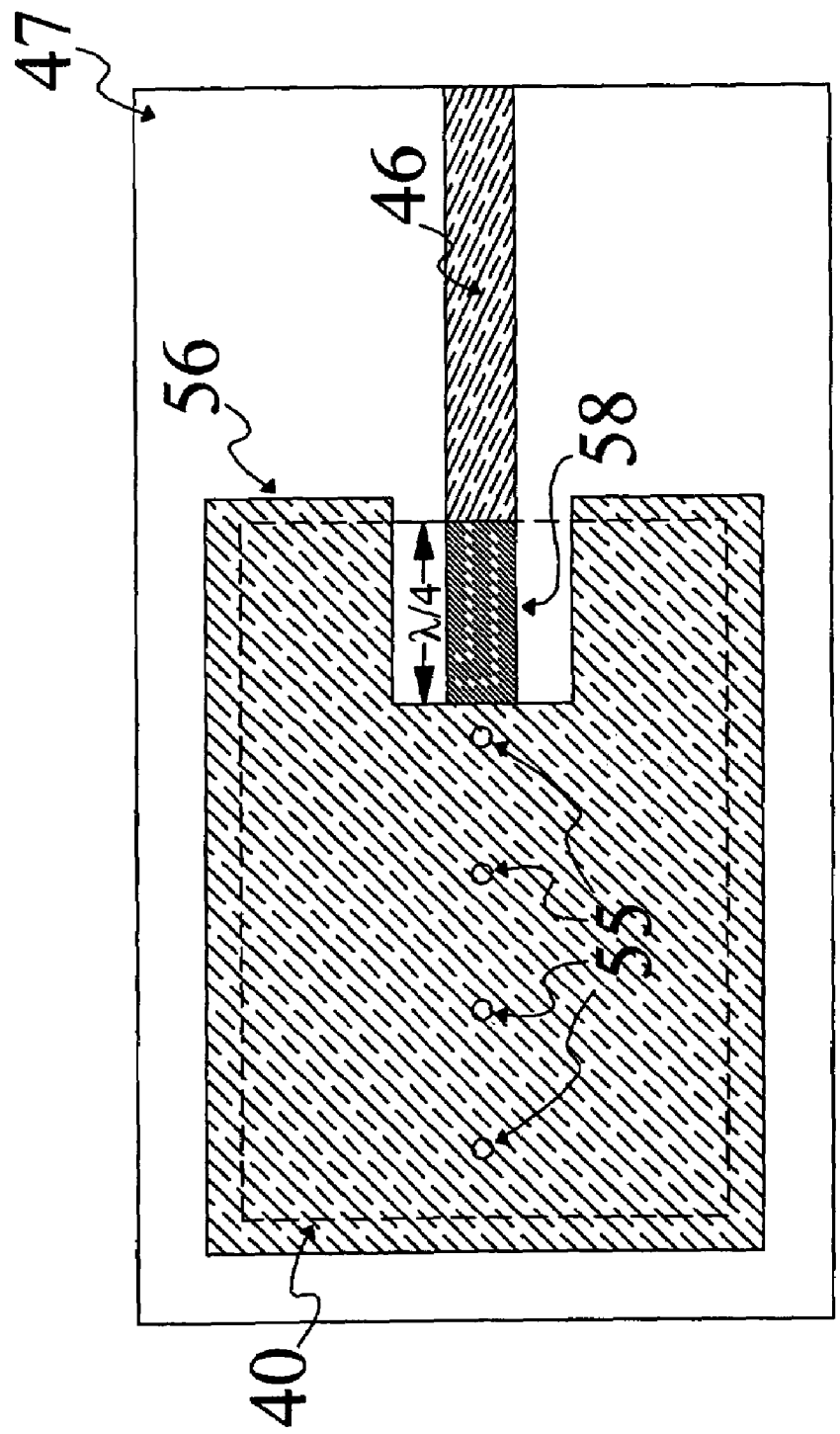

FIG. 4b shows the metal footprint on the bottom surface of RF electronic component 40 and FIG. 5 shows a top view of carrier substrate 47, upon which RF electronic component 40 is mounted. The outer edges of RF electronic component 40 are represented in FIG. 4b and in FIG. 5 by dotted lines.

Top metal layer 47a of carrier substrate 47 includes a land pattern comprising a ground pattern 56, and a solder pad 58 where ground pattern 56 and solder pad 58 substantially mirror the footprint of electronic component 40 shown in FIG. 4b. Thus, when electronic component 40 is soldered to carrier substrate 47, input/output terminal 48 of electronic component 40 aligns with solder terminal 58 on carrier substrate 47, and bottom ground plane 44c of electronic component 40 aligns substantially with ground pattern 56. Ground pattern 56 is typically connected to the bottom metal layer 47b of carrier substrate 47 by a multiplicity of metal plated through holes 55.

Figure 6:
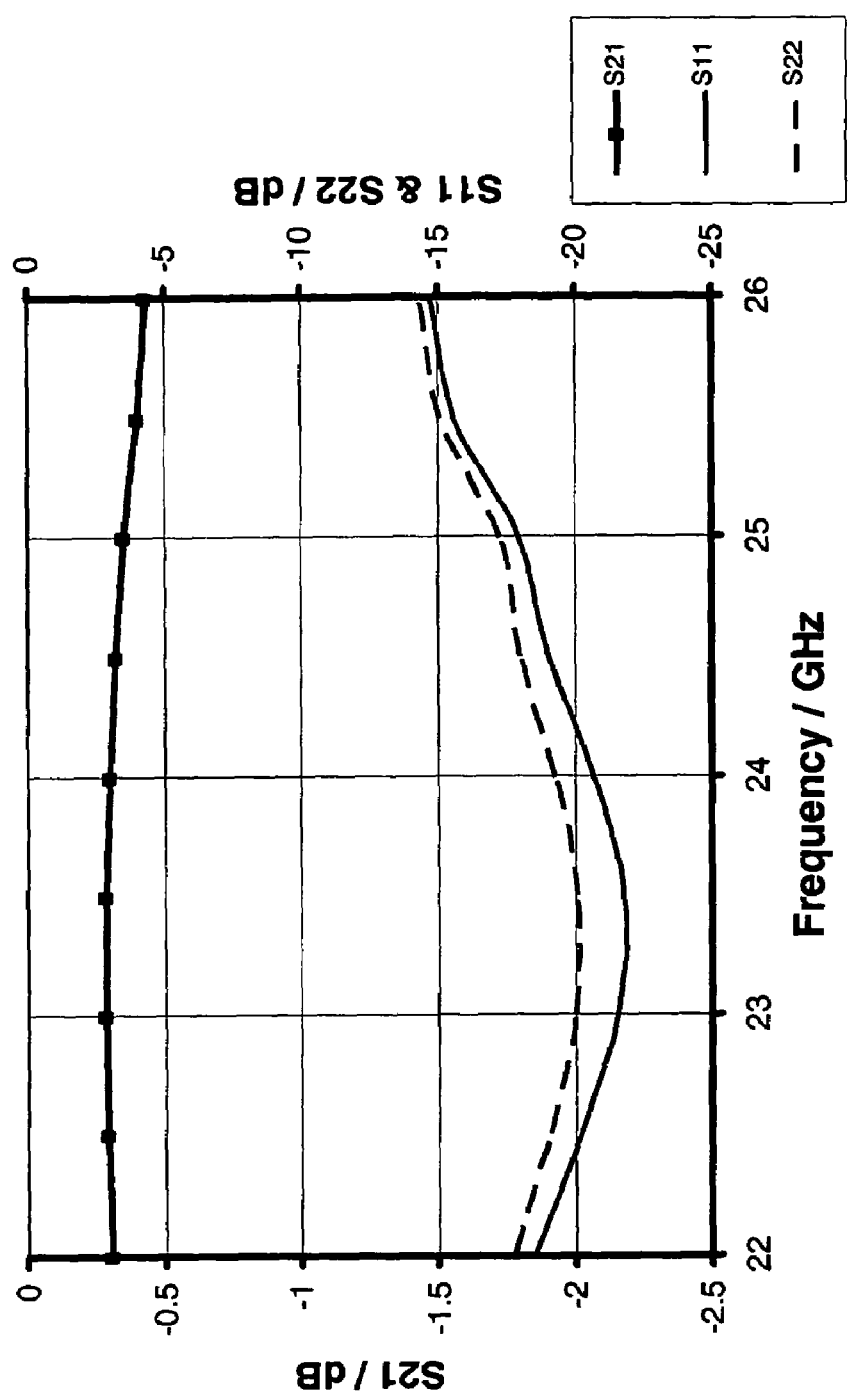

FIG. 6 shows the S Parameters which were derived by a 3D electromagnetic simulation of the transition shown in FIG. 4a between ports P1 & P2 with 50 Ohm terminations at both ports. It can be seen from the graph S21 that the transition has low insertion loss; similarly from the graphs of S11 and S22 it can be seen that the transition is well matched to the terminations at ports P1 and P2 indicating that the transition has the required properties.

The invention claimed is:

1. An assembly comprising:
   an RF electronic component for mounting on a carrier substrate, said RF electronic component including:
   a housing;
   at least one electronic device having an input and/or output and incorporated in said housing;
   at least one input/output terminal for connecting to a connection pad on said substrate; and
   an electrical transition for providing an electrical connection between said input/output terminal and an input/output of said at least one electronic device incorporated in said electronic component, said electrical transition comprising:
   a side termination at least partially located on an outer surface of said housing; and
   an array of conductive through holes formed inside said housing, said array being arranged so that the axes of said through holes are substantially mutually parallel and coplanar, and so that a plane defined by said array of coplanar through holes is parallel to and offset from said side termination, and wherein said array of through holes are connected to form a ground plane at said offset from said side termination; and
   the carrier substrate having an upper surface on which said RF electronic component is mounted, and having at least one transmission line including a connection pad electrically connected to a respective input/output terminal of said RF electronic component;
   wherein said offset, the dimensions of said through holes, and the arrangement of said through holes of said side termination are selected so that the electrical properties of said transition between said connection pad and said device input/output are equivalent to the electrical properties of a transmission line of a given characteristic impedance connected to said connection pad.

2. The assembly as claimed in claim 1 wherein said through holes are cylindrical and either metal plated or metal filled.

3. The assembly as claimed in claim 1 wherein said housing comprises a multi-layer substrate formed of multiple layers of electrically insulating material having at least an upper and a lower layer, a lower outer surface of the multi-layer substrate being arranged to be mounted on said carrier substrate, said lower layer of said multi-layer substrate having formed on upper and lower major surfaces thereof respective ground planes, said array of through holes electrically connecting said ground planes.

4. The assembly as claimed in claim 1 wherein said carrier substrate comprises a PCB.

5. The assembly as claimed in claim 1 wherein said housing has a lower outer surface having a ground plane formed thereon and wherein said carrier substrate has a ground plane formed on said upper surface, said carrier substrate ground plane being at least coextensive with said lower outer surface ground plane.

6. The assembly according to claim 3 wherein said lower major surface of said lower layer comprises said lower outer surface of said multi-layer substrate.

7. The assembly according to claim 3 wherein said lower major surface of said lower layer is spaced from said lower outer surface of said multi-layer substrate by an insulating layer, said lower outer surface of said multi-layer substrate including a further ground plane electrically connected to said lower major surface ground plane by one or more conductive through holes.

8. The assembly as claimed in claim 3 wherein said at least one electronic device is disposed on a surface of an upper layer of said multi-layer substrate, said side termination extending between said lower outer surface of said multi-layer substrate and said surface of said upper layer.

9. The assembly as claimed in claim 3 wherein said multi-layer substrate comprises an LTCC substrate.

10. The assembly as claimed in claim 7 wherein said RF electronic component has an operating frequency, and wherein said input/output terminal is located on said lower outer surface of said multi-layer substrate and has a length between first and second ends, said first end being connected to said side termination, and said second end being connected to said ground plane of said lower outer surface of said multi-layer substrate, and wherein said length is one quarter of the wavelength of said operating frequency.

11. The assembly as claimed in claim 10 wherein said operating frequency is a microwave frequency.

12. The assembly as claimed in claim 10 wherein said frequency is in the region of 24 GHz.

* * * * *